US008721929B2

(12) United States Patent
Loevenich et al.

(10) Patent No.: US 8,721,929 B2
(45) Date of Patent: May 13, 2014

(54) POLYTHIOPHENE POLYANION COMPLEXES IN HOMOPOLAR ORGANIC SOLVENTS

(75) Inventors: Wilfried Loevenich, Bergisch-Gladbach (DE); Stephan Kirchmeyer, Leverkusen (DE); Andreas Elschner, Mülheim (DE); Knud Reuter, Krefeld (DE); Klaus Müllen, Köln (DE); Markus Klapper, Mainz (DE); Kevin Müller, Waldems (DE)

(73) Assignee: Heraeus Precious Metals GmbH & Co. KG (DE)

( * ) Notice: Subject to any disclaimer, the term of this patent is extended or adjusted under 35 U.S.C. 154(b) by 575 days.

(21) Appl. No.: 12/991,050

(22) PCT Filed: Apr. 20, 2009

(86) PCT No.: PCT/EP2009/054650
§ 371 (c)(1),
(2), (4) Date: Apr. 1, 2011

(87) PCT Pub. No.: WO2009/135752
PCT Pub. Date: Nov. 12, 2009

(65) Prior Publication Data
US 2011/0168946 A1    Jul. 14, 2011

(30) Foreign Application Priority Data
May 9, 2008 (DE) .......................... 10 2008 023 008

(51) Int. Cl.
*H01B 1/00* (2006.01)
*C08G 75/00* (2006.01)
*H01J 1/62* (2006.01)

(52) U.S. Cl.
USPC ............................ 252/500; 528/377; 313/504

(58) Field of Classification Search
USPC ............... 252/500–521.6; 528/377, 422, 423; 313/504
See application file for complete search history.

(56) References Cited

U.S. PATENT DOCUMENTS

| | | | |
|---|---|---|---|
| 4,959,430 A | 9/1990 | Jonas et al. | |
| 4,987,042 A | 1/1991 | Jonas et al. | |
| 5,035,926 A | 7/1991 | Jonas et al. | |
| 5,300,575 A | 4/1994 | Jonas et al. | |

(Continued)

FOREIGN PATENT DOCUMENTS

| | | |
|---|---|---|
| CN | 1654506 A | 8/2005 |
| DE | 10324534 A1 | 10/2004 |

(Continued)

OTHER PUBLICATIONS

Luebben et al, "Solvent processable conducting block copolymers based on poly (3,4-ethylenedioxythiophene)", Polymeric Materials: Science and Engineering 2004, vol. 91, p. 979.

(Continued)

*Primary Examiner* — Mark Kopec
*Assistant Examiner* — Jaison Thomas
(74) *Attorney, Agent, or Firm* — Novak Druce Connolly Bove + Quigg LLP

(57) ABSTRACT

The invention relates to novel polythiophene-polyanion complexes which are soluble or dispersible in nonpolar organic solvents, and to the use thereof.

16 Claims, 1 Drawing Sheet

(56) References Cited

U.S. PATENT DOCUMENTS

| | | | |
|---|---|---|---|
| 7,008,562 B2 * | 3/2006 | Jonas et al. | 252/500 |
| 7,279,015 B2 | 10/2007 | Merker | |
| 7,938,986 B2 * | 5/2011 | Elschner et al. | 252/500 |
| 7,973,180 B2 * | 7/2011 | Morita et al. | 549/50 |
| 2005/0175861 A1 | 8/2005 | Elschner et al. | |
| 2006/0071201 A1 | 4/2006 | Jonas et al. | |
| 2006/0180797 A1 * | 8/2006 | Merker et al. | 252/500 |
| 2006/0180810 A1 * | 8/2006 | Lee et al. | 257/40 |

FOREIGN PATENT DOCUMENTS

| | | |
|---|---|---|
| DE | 60201828 T2 | 12/2005 |
| DE | 102004022110 A1 | 12/2005 |
| DE | 60216460 T2 | 9/2007 |
| EP | 0339340 A2 | 11/1989 |
| EP | 0440957 A2 | 8/1991 |
| EP | 1373356 B1 | 5/2005 |
| EP | 1564251 A1 | 8/2005 |
| JP | 2005-068166 A | 3/2005 |
| JP | 2008045116 A | 2/2008 |
| TW | I235171 B | 7/2005 |
| WO | WO-02/080627 A2 | 10/2002 |
| WO | WO-02/080627 | 3/2003 |
| WO | WO-03/048228 A1 | 6/2003 |

OTHER PUBLICATIONS

Okamura et al, "Synthesis of random and block copolymers and styrene and styrenesulfonic acid with low polydispersity using nitroxide-mediated living radical polymerization technique", Polymer, 2002, vol. 43, pp. 3155-3162.

Yamamoto et al, "Neutral poly (3,4-ethylenedioxythiophene-2,5-diyl)s: preparation by organometallic polycondensation and their unique p-doping behaviour", Polymer, 2002, vol. 43, pp. 711-719.

Lee et al, "Polymer light-emitting devices using ionomers as an electron injecting and hole blocking layer" Journal of Applied Physics, 2001, vol. 90, No. 5, pp. 2128-2134.

International Preliminary Report on Patentability from corresponding PCT/EP2009/054650 application.

International Search Report for PCT/EP2009/054650, mailing date Aug. 5, 2009.

Taiwanese Examination Report for patent application No. 98115216, dated Dec. 30, 2013.

English Translation of the Taiwanese Examination Report for patent No. 98115216, dated Dec. 20, 2013.

\* cited by examiner

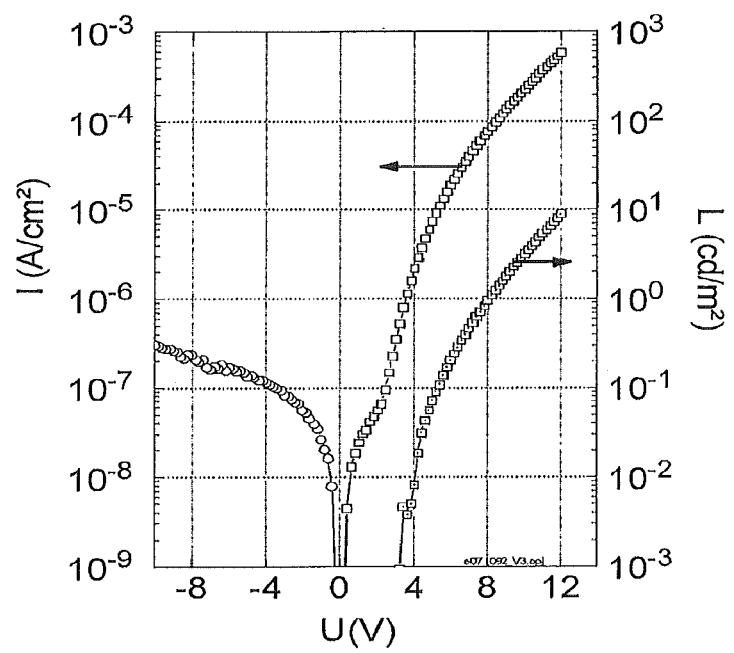

POLYTHIOPHENE POLYANION COMPLEXES IN HOMOPOLAR ORGANIC SOLVENTS

The invention relates to novel polythiophene-polyanion complexes which are soluble or dispersible in nonpolar organic solvents, and to the use thereof.

Conductive polymers are gaining increasing economic significance since polymers have advantages over metals with regard to processability, to weight and to the controlled adjustment of properties by chemical modification. Examples of known π-conjugated polymers are polypyrroles, polythiophenes, polyanilines, polyacetylenes, polyphenylenes and poly(p-phenylene-vinylenes). Layers of conductive polymers have various industrial uses, for example as a polymeric counterelectrode in capacitors or for through-connection of electronic circuit boards. Conductive polymers are prepared by chemical or electrochemical, oxidative means from monomeric precursors, for example optionally substituted thiophenes, pyrroles and anilines and their respective derivatives which may be oligomeric. Especially chemically oxidative polymerization is widespread, since it is technically simple to achieve in a liquid medium and on various substrates.

A particularly important and industrially utilized polythiophene is poly(ethylene-3,4-dioxythiophene) (PEDOT or PEDT), described, for example, in EP 339 340 A2, which is prepared by chemically polymerizing ethylene-3,4-dioxythiophene (EDOT or EDT) and which, in its oxidized form, has very high conductivities. An overview of numerous poly(alkylene-3,4-dioxythiophene) derivatives, especially poly(ethylene-3,4-dioxythiophene) derivatives, and the monomer units, syntheses and applications thereof is given by L. Groenendaal, F. Jonas, D. Freitag, H. Pielartzik & J. R. Reynolds, Adv. Mater. 12, (2000) p. 481-494.

Particular industrial significance has been gained by dispersions of PEDOT with polystyrenesulphonic acid (PSS), as disclosed, for example, in EP 0440 957 B1. From these dispersions, it is possible to obtain transparent, conductive films which have found a multitude of applications, for example as an antistatic coating or as a hole injection layer in organic light-emitting diodes.

EDT is polymerized in an aqueous solution of PSS to form a PEDT/PSS complex. Cationic polythiophenes, which contain polymeric anions as counterions for charge compensation, are often also referred to in the technical field as polythiophene/polyanion complexes. Owing to the polyelectrolyte properties of PEDT as a polycation and PSS as a polyanion, this complex is not a true solution, but rather a dispersion. To what extent polymers or portions of the polymers are dissolved or dispersed depends on the mass ratio of the polycation and of the polyanion, on the charge density of the polymers, on the salt concentration of the environment and on the nature of the surrounding medium (V. Kabanov, Russian Chemical Reviews 74, 2005, 3-20). The transitions may be fluid. Therefore, no distinction is made hereinafter between the terms "dispersed" and "dissolved". Equally, no distinction is made between "dispersion" and "solution" or between "dispersant" and "solvent". Instead, these terms are used hereinafter in an equivalent manner.

In the prior art, only the preparation of polythiophene-polyanion complexes in polar solvents has been possible to date. EP 0440957 A2 describes a preparation of polythiophene-polyanion complexes, which is performable only in very polar solvents, since the polyanions described by way of example, polystyrenesulphonic acid and poly(meth)acrylic acid are soluble only in polar solvents such as water or lower alcohols. Only the polymerization of PEDT in water is described specifically. A disadvantage in this process is that the selection of the solvent is restricted to polar solvents, i.e. nonpolar solvents cannot be used in this preparation process for polythiophene-polyanion-complexes.

EP 1373356 B1 and WO 2003/048228 describe the preparation of polythiophene-polyanion complexes in anhydrous or low-water solvents. In this case, the water solvent is exchanged for another water-miscible organic solvent. To this end, the second solvent is added and then water is removed, for example by distillation. This procedure has the disadvantage that, owing to the distillation, a two-stage process has to be used. Moreover, the added solvent has to be water-miscible, which likewise constitutes a restriction to polar solvents.

Otani et al. describe, in JP 2005-068166, a process in which a conductive polymer such as PEDOT is first dried and then dispersed in an organic solvent. The organic solvents mentioned are especially those which have a dielectric constant of 5 or more. The examples specify isopropyl alcohol and gamma-butyrolactone. This process too has the disadvantage that, for the redissolution, polar solvents are required. Another disadvantage in this process is that the conductive polymer first has to be synthesized, then and subsequently redispersed. Otani et al. do not disclose any polythiophene-polyanion complexes.

In 2002, H. Okamura et al. (Polymer 2002, 43, 3155-3162) described the synthesis of a block copolymer of styrene and styrenesulphonic acid. The proportions of the two comonomers were varied and it was found that the copolymer is soluble in tetrahydrofuran, chloroform, acetone, dimethylformamide, methanol and water. However, no solubility whatsoever of the said copolymer was found in aliphatic or aromatic hydrocarbons such as hexane, toluene or benzene. Nor were any complexes with conductive polymers whatsoever prepared, for example polythiophene/polyanion complexes, nor were conductivities or resistances of films studied. The polymers described by Okamura et al. are thus unsuitable for ensuring the solubility of a polymer complex in very nonpolar solvents such as toluene.

A series of studies also describe how the solubility of a polythiophene is achieved by the attachment of side groups on the thiophene monomer and subsequent polymerization or else by preparing a block copolymer of thiophene units and units for enhancing the solubility.

For instance, Luebben et al. describe, in Polymeric Materials: Science & Engineering 2004, 91, 979, the preparation of a block copolymer of PEDOT and polyethylene glycol. The counterions used here are perchlorate and p-toluenesulphonic acid. The polymers are soluble in polar organic solvents such as propylene carbonate and nitromethane. Conductivities of $10^{-4}$ S/cm to 1 S/cm are measured. The block copolymers, however, have the disadvantage that they are soluble only in very polar solvents. Moreover, the counterions selected do not contribute to film formation, and so conductive films cannot be formed with these block copolymers.

Further publications describe the preparation of organic polythiophene solutions by the introduction of side groups on the thiophene, which contribute to solubility. For instance, Yamamoto et al., in Polymer 43, 2002, 711-719, describe the preparation of the hexyl derivative of PEDOT, which, as an uncharged molecule, is soluble in organic solvents, Doping or oxidation with iodine is also described. However, there is no indication as to whether conductive films can be produced from organic solutions of the doped or oxidized thiophene. A further disadvantage in this approach is that the molecular weight of the polymers is low and, therefore, the film formation properties are poor. In the above-cited publication, molecular weights ($M_w$) of 2400 g/mol and 8500 g/mol are achieved. Since polythiophene functions simultaneously as a film-forming polymer and as a conductive polymer, the two properties cannot be established independently of one another. In principle, this method harbours the disadvantage that the introduction of side chains on the thiophene influences not just the solubility properties, but also the electronic properties of the molecule.

There was therefore a need for dispersions of electrically conductive polythiophene in nonpolar solvents, with which conductive films can be produced. This need is based on the fact that such dispersions have to date been available only in very polar solvents. More particularly, there is a need for dispersions in nonpolar solvents, which have good film-forming properties and exhibit electrical conductivity. Since many coating systems are based on nonpolar solvents, there is a great need for conductive polythiophenes which are dissolved or dispersed in nonpolar solvents.

It was thus an object of the invention to prepare dispersions of polythiophenes, which are soluble in nonpolar solvents and from which conductive films can be produced. It was a further object of the invention to prepare such dispersions, the solvent used in the synthesis simultaneously being the solvent of the finished dispersion, such that no exchange of the solvent is required.

It has now been found that, surprisingly, complexes of optionally substituted polythiophenes and polyanions, said polyanions comprising copolymers, solve this problem.

The present invention therefore provides a complex comprising an optionally substituted polythiophene and a polyanion, characterized in that the polyanion comprises a copolymer with repeat units of the general formulae (I) and (II), or repeat units of the general formulae (I) and (III), or repeat units of the general formulae (II) and (III), or repeat units of the general formulae (I), (II) and (III)

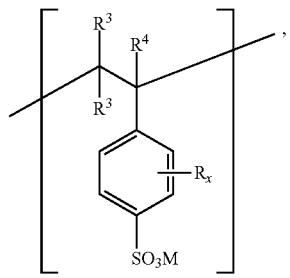

(I)

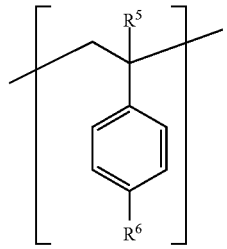

(II)

(III)

where
R$^1$, R$^2$, R$^3$, R$^4$, R$^5$ are each independently H, an optionally substituted $C_1$-$C_{18}$-alkyl radical, an optionally substituted $C_1$-$C_{18}$-alkoxy radical, an optionally substituted $C_5$-$C_{12}$-cycloalkyl radical, an optionally substituted $C_6$-$C_{14}$-aryl radical, an optionally substituted $C_7$-$C_{18}$-aralkyl radical, an optionally substituted $C_1$-$C_4$-hydroxyalkyl radical or a hydroxyl radical, preferably H,
R$^6$ is H or an optionally substituted $C_1$-$C_{30}$-alkyl radical, preferably a $C_2$-$C_{18}$-alkyl radical,
D is a direct covalent bond or an optionally substituted $C_1$-$C_5$-alkylene radical,
R is a linear or branched, optionally substituted $C_1$-$C_{18}$ alkyl radical, an optionally substituted $C_5$-$C_{12}$-cycloalkyl radical, an optionally substituted $C_6$-$C_{14}$-aryl radical, an optionally substituted $C_7$-$C_{18}$-aralkyl radical, an optionally substituted $C_1$-$C_4$-hydroxyalkyl radical or a hydroxyl radical, preferably H,
x is an integer from 0 to 4, preferably 0, 1 or 2, more preferably 0 or 1, and
M is H or Li$^+$, Nat K$^+$, Rb$^+$, Cs$^+$, NH$_4^+$, Na$^+$, K$^+$ or another cation, preferably H.

The general formula (II) should be understood such that the substituent R may be bonded x times on the aromatic ring.

In a preferred embodiment of the invention, the polyanion of the complex is a copolymer with repeat units of the formulae (II) and (III).

In an even further preferred embodiment of the invention, the polyanion is a copolymer with repeat units of the formulae (IIa) and (III)

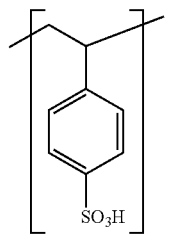

(IIa)

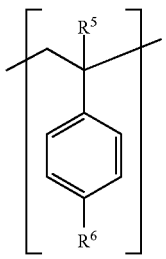

(III)

where

R⁵ is H or an optionally substituted $C_1$-$C_{18}$-alkyl radical, preferably H or an optionally substituted $C_1$-$C_6$-alkyl radical, more preferably a methyl radical or H, most preferably H, and R⁶ is H or an optionally substituted $C_1$-$C_{30}$-alkyl radical, preferably an optionally substituted $C_1$-$C_{20}$-alkyl radical, more preferably an optionally substituted $C_1$-$C_{12}$-alkyl radical.

The proportions of the repeat units of the general formulae (I), (II) and (III) in the overall polymer are, respectively, a, b and c, a, b and c are percentages by mass which are between 0-100%. a and b are preferably between 0 and 50%, where a and b must not both be 0%. The proportion of c is preferably between 20-100%.

In the context of the invention, $C_1$-$C_{18}$-alkyl represents linear or branched $C_1$-$C_{18}$-alkyl radicals, for example methyl, ethyl, n- or isopropyl, n-, iso-, sec- or tert-butyl, n-pentyl, 1-methylbutyl, 2-methylbutyl, 3-methylbutyl, 1-ethylpropyl, 1,1-dimethylpropyl, 1,2-dimethyl-propyl, 2,2-dimethylpropyl, n-hexyl, n-heptyl, n-octyl, 2-ethylhexyl, n-nonyl, n-decyl, n-undecyl, n-dodecyl, n-tridecyl, n-tetradecyl, n-hexadecyl, n-heptadecyl or n-octadecyl; $C_1$-$C_{30}$-alkyl represents linear or branched $C_1$-$C_{30}$-alkyl radicals which, as well as the abovementioned $C_1$-$C_{18}$ alkyl radicals, include alkyl radicals such as n-nonadecyl, n-eicosanyl, n-henicosanyl, n-docosanyl, n-tricosanyl, n-tetracosanyl, n-pentacosanyl, n-hexacosanyl, n-heptacosanyl, n-octacosanyl, n-nonacosanyl or n-triacontanyl. In the context of the invention, $C_1$-$C_{18}$-alkoxy radicals represent the alkoxy radicals corresponding to the $C_1$-$C_{18}$-alkyl radicals listed above. In the context of the invention, $C_5$-$C_{12}$-cycloalkyl represents $C_5$-$C_{12}$-cycloalkyl radicals such as cyclopentyl, cyclohexyl, cycloheptyl, cyclo-octyl, cyclononyl or cyclodecyl, $C_6$-$C_{14}$-aryl represents $C_6$-$C_{14}$-aryl radicals such as phenyl or naphthyl, and $C_7$-$C_{18}$-aralkyl represents $C_7$-$C_{18}$-aralkyl radicals such as benzyl, o-, m-, p-tolyl, 2,3-, 2,4-, 2,5-, 2,6-, 3,4-, 3,5-xylyl or mesityl. In the context of the invention, $C_1$-$C_4$-hydroxyalkyl is understood to mean a $C_1$-$C_4$-alkyl radical which has, as substituents, a hydroxyl group, and where the $C_1$-$C_4$-alkyl radical may, for example, be methyl, ethyl, n- or isopropyl, n-, iso-, sec- or tert-butyl; a $C_1$-$C_8$-alkylene radical is understood to mean a methylene, ethylene, n-propylene, n-butylene or n-pentylene. The above lists serve to illustrate the invention by way of example and should not be considered to be conclusive.

In the context of the invention, the polyanions have a weight-average molecular weight ($M_w$) which is between 2 000 to 5 000 000 g/mol, preferably between 10 000 to 1 000 000 g/mol, and most preferably between 40 000 g/mol and 600 000 g/mol.

The molecular weight of the polyanions can be determined by means of gel permeation chromatography (GPC). To this end, the polymer is dissolved in a solvent (e.g. chloroform or tetrahydrofuran) and passed through a GPC column. The reference standard used may be polystyrene in the same solvent. The detectors used may be UV detectors or refractive index detectors.

The polyanions can be prepared from the corresponding monomers. The ratio of the repeat units in the polymer can be determined via the ratio of the monomers used, where the ratios mentioned need not be identical owing to different reaction rates. The polymerization can be initiated with free-radical, anionic or cationic initiators. In addition, transition metal complexes can serve for initiation. Synthesis methods for preparation of polymers are described in the handbook "Makromoleküle" [Macromolecules] by H.-G. Elias, Volume 1.

In addition to the polyanions defined in detail above, the inventive complex comprises optionally substituted polythiophenes comprising repeat units of the general formula (IV)

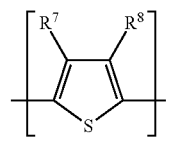

(IV)

where

R⁷ and R⁸ are each independently H, an optionally substituted $C_1$-$C_{18}$-alkyl radical or an optionally substituted $C_1$-$C_{18}$-alkoxy radical, or R⁷ and R⁸ together are an optionally substituted $C_1$-$C_8$-alkylene radical, an optionally substituted $C_1$-$C_8$-alkylene radical in which one or more carbon atom(s) may be replaced by one or more identical or different heteroatoms selected from O or S, preferably a $C_1$-$C_8$-dioxyalkylene radical, an optionally substituted $C_1$-$C_8$-oxythiaalkylene radical or an optionally substituted $C_1$-$C_8$-dithiaalkylene radical, or an optionally substituted $C_1$-$C_8$-alkylidene radical in which at least one carbon atom may optionally be replaced by a heteroatom selected from O or S.

In preferred embodiments, polythiophenes comprising repeat units of the general formula (IV) are those comprising repeat units of the general formula (IV-a) and/or of the general formula (IV-b)

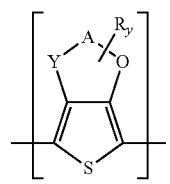

(IV-a)

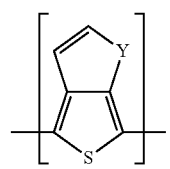

(IV-b)

in which

A is an optionally substituted $C_1$-$C_5$-alkylene radical, preferably an optionally substituted $C_2$-$C_3$-alkylene radical, Y is O or S, R is a linear or branched, optionally substituted $C_1$-$C_{18}$-alkyl radical, preferably linear or branched, optionally substituted $C_1$-$C_{14}$-alkyl radical, an optionally substituted $C_5$-$C_{12}$-cycloalkyl radical, an optionally substituted $C_6$-$C_{14}$-aryl radical, an optionally substituted $C_7$-$C_{18}$-aralkyl radical, an optionally substituted $C_1$-$C_4$-hydroxyalkyl radical or a hydroxyl radical, y is an integer from 0 to 8, preferably 0, 1 or 2, more preferably 0 or 1, and, in the case that a plurality of R radicals are bonded to A, they may be the same or different.

The general formula (IV-a) should be understood such that the substituent R may be bonded y times to the alkylene radical A.

In further preferred embodiments, polythiophenes comprising repeat units of the general formula (IV) are those comprising repeat units of the general formula (IV-aa) and/or of the general formula (IV-ab)

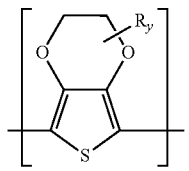

(IV-aa)

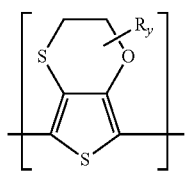

(IV-ab)

in which
R and y are each as defined above.

In still further preferred embodiments, polythiophenes comprising repeat units of the general formula (IV) are those comprising polythiophenes of the general formula (IV-aaa) and/or of the general formula (IV-aba)

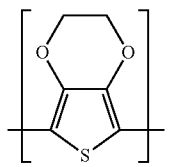

(IV-aaa)

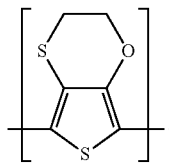

(IV-aba)

In the context of the invention, the prefix "poly-" should be understood such that more than one identical or different repeat unit is present in the polythiophene. The polythiophenes contain a total of n repeat units of the general formula (IV), where n may be an integer from 2 to 2000, preferably 2 to 100. The repeat units of the general formula (IV) may each be the same or different within a polythiophene. Preference is given to polythiophenes containing the same repeat units of the general formula (IV) in each case.

On the end groups, the polythiophenes preferably each bear H.

In particularly preferred embodiments, the polythiophene with repeat units of the general formula (I) is poly(3,4-ethylenedioxythiophene), poly(3,4-ethylenoxythiathiophene) or poly(thieno[3,4-b]thiophene, i.e. a homopolythiophene composed of repeat units of the formula (IV-aaa), (IV-aba) or (IV-b).

In further particularly preferred embodiments, the polythiophene with repeat units of the general formula (IV) is a copolymer composed of repeat units of the formula (IV-aaa) and (IV-aba), (IV-aaa) and (IV-b), (IV-aba) and (IV-b) or (IV-aaa), (IV-aba) and (IV-b), preference being given to copolymers composed of repeat units of the formula (IV-aaa) and (IV-aba), and also (IV-aaa) and (IV-b).

In the context of the invention, $C_1$-$C_5$-alkylene radicals A are methylene, ethylene, n-propylene, n-butylene or n-pentylene, and $C_1$-$C_8$-alkylene radicals are additionally n-hexylene, n-heptylene and n-octylene. In the context of the invention, $C_1$-$C_8$-alkylidene radicals are above-listed $C_1$-$C_8$-alkylene radicals containing at least one double bond. In the context of the invention, $C_1$-$C_8$-dioxyalkylene radicals, $C_1$-$C_8$-oxythiaalkylene radicals and $C_1$-$C_8$-dithiaalkylene radicals are the $C_1$-$C_8$-dioxyalkylene radicals, $C_1$-$C_8$-oxythiaalkylene radicals and $C_1$-$C_8$-dithiaalkylene radicals corresponding to the above-listed $C_1$-$C_8$-alkylene radicals. $C_1$-$C_{18}$-Alkyl, $C_5$-$C_{12}$-cycloalkyl, $C_6$-$C_{14}$-aryl, $C_7$-$C_{18}$-aralkyl, $C_1$-$C_{18}$-alkoxy and $C_1$-$C_4$-hydroxyalkyl are each as defined above. The above lists serve to illustrate the invention by way of example and should not be considered to be conclusive.

Possible further substituents of the above radicals include numerous organic groups, for example alkyl, cycloalkyl, aryl, halogen, ether, thioether, disulphide, sulphoxide, sulphone, sulphonate, amino, aldehyde, keto, carboxylic ester, carboxylic acid, carbonate, carboxylate, cyano, alkylsilane and alkoxysilane groups, and also carboxamide groups.

Processes for preparing the monomeric precursors for the preparation of the polythiophenes of the general formula (IV) and derivatives thereof are known to those skilled in the art and are described, for example, in L. Groenendaal, F. Jonas, D. Freitag, H. Pielartzik & J. R. Reynolds, Adv. Mater. 12 (2000) 481-494 and literature cited therein.

In the context of the invention, derivatives of the above-listed thiophenes are understood to mean, for example, dimers or trimers of these thiophenes. Higher molecular weight derivatives, i.e. tetramers, pentamers etc., of the monomeric precursors are also possible as derivatives. The derivatives may be formed either from identical or different monomer units and may be used in pure form or else as a mixture with one another and/or with the aforementioned thiophenes. In the context of the invention, oxidized or reduced forms of these thiophenes and thiophene derivatives are also encompassed by the term "thiophenes and thiophene derivatives", when the polymerization thereof forms the same conductive polymers as in the case of the above-listed thiophenes and thiophene derivatives.

The dispersion or solution may additionally comprise at least one polymeric binder. Suitable binders are polymeric organic binders, for example polyvinyl alcohols, polyvinylpyrrolidones, polyvinyl chlorides, polyvinyl acetates, polyvinyl butyrates, polyacrylic esters, polyacrylamides, polymethacrylic esters, polymethacrylamides, polyacrylonitriles, styrene/acrylic ester, vinyl acetate/acrylic ester and ethylene/vinyl acetate copolymers, polybutadienes, polyisoprenes, polystyrenes, polyethers, polyesters, polycarbonates, polyurethanes, polyamides, polyimides, polysulphones, melamine-formaldehyde resins, epoxy resins, silicone resins or celluloses.

The optionally substituted polythiophenes are cationic, "cationic" referring only to the charges which reside on the main polythiophene chain. According to the substituent on the R radicals, the polythiophenes may bear positive and negative charges in the structural unit, in which case the positive charges are on the main polythiophene chain and the negative charges may be on the R radicals substituted by sulphonate or carboxylate groups. In that case, the positive charges of the main polythiophene chain may be partly or fully saturated by any anionic groups present on the R radicals. Viewed overall, the polythiophenes in these cases may be cationic, uncharged or even anionic. Nevertheless, in the context of the invention, they are all considered to be cationic polythiophenes, since the positive charges on the main polythiophene chain are crucial. The positive charges are not shown in the formulae, since their exact number and position cannot be stated unambiguously. The number of positive charges is, however, at least 1 and at most n, where n is the total number of repeat units (identical or different) within the polythiophene.

The inventive polythiophene/polyanion complex is soluble or dispersible in a solvent which is water-immiscible. Suitable solvents include in particular the following organic solvents which are inert under the reaction conditions: aromatic hydrocarbons such as toluene and xylene; aliphatic hydrocarbons such as hexane, heptane and cyclohexane; aliphatic carboxylic esters such as ethyl acetate; chlorohydrocarbons such as dichloromethane and dichloroethane; aliphatic and araliphatic ethers such as diethyl ether or tetrahydrofuran. Particular preference is given to aliphatic and aromatic hydrocarbons.

The optionally substituted polythiophenes of the general formula (IV) can be prepared by oxidative polymerization of optionally substituted thiophenes of the general formula (V)

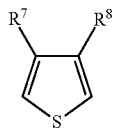

(V)

where $R^7$ and $R^8$ are each as defined above.

For the optionally substituted thiophenes of the general formula (V), the same areas of preference apply as for the optionally substituted polythiophenes of the general formula (IV).

For this oxidative polymerization, it is possible to use the oxidizing agents which are suitable for the oxidative polymerization of thiophenes and are known to those skilled in the art; these are described, for example, in J. Am. Chem. Soc., 85, 454 (1963). In the context of the invention, the oxidizing agents used may be $H_2O_2$, $K_2Cr_2O_7$, alkali metal and ammonium peroxodisulphates, for example sodium or potassium peroxodisulphate, alkali metal perborates, potassium permanganate, copper salts such as copper tetrafluoroborate, or cerium(IV) salts or $CeO_2$. Preference is given to inexpensive and easy-to-handle oxidizing agents such as iron(III) salts of inorganic acids, for example $FeCl_3$, $Fe(ClO_4)_3$, and the iron (III) salts of organic acids and of inorganic acids having organic radicals.

Examples of iron(III) salts of inorganic acids having organic radicals include the iron(III) salts of the sulphuric monoesters of $C_1$-$C_{20}$-alkanols, e.g. the Fe(III) salt of laurylsulphate. Examples of iron(III) salts of organic acids include: the Fe(III) salts of $C_1$-$C_{20}$-alkanesulphonic acids, such as of methane- and of dodecanesulphonic acid, of aliphatic $C_1$-$C_{20}$-carboxylic acids such as of 2-ethylhexylcarboxylic acid, aliphatic perfluorocarboxylic acids, such as of trifluoroacetic acid and of perfluorooctanoic acid, of aliphatic dicarboxylic acids, such as of oxalic acid, and in particular of aromatic sulphonic acids optionally substituted by $C_1$-$C_{20}$-alkyl groups, such as of benzenesulphonic acid, p-toluenesulphonic acid and of dodecylbenzenesulphonic acid, and of cycloalkanesulphonic acids such as camphorsulphonic acid.

In the context of the invention, $C_1$-$C_{20}$-alkanol represents monohydric alcohols having an alkyl radical of 1-20 carbon atoms, $C_1$-$C_{20}$-alkanesulphonic acid represents monobasic sulphonic acid with an alkyl radical of 1-20 carbon atoms, and a $C_1$-$C_{20}$-carboxylic acid represents monobasic carboxylic acids with an alkyl radical of 1-20 carbon atoms.

It has now been found that, surprisingly, for the polymerization of the optionally substituted thiophene of the general formula (V), only a low solubility of the oxidizing agent used in the reaction medium, i.e. the nonpolar solvent, is required. For example, iron(III) tosylate is substantially insoluble in toluene. Nevertheless, EDT is polymerized by iron(III) tosylate in toluene to give PEDT.

The present invention therefore further provides a process for preparing optionally substituted polythiophenes of the general formula (IV) in the presence of the polyanions, characterized in that the oxidative polymerization of optionally substituted thiophenes of the general formula (V)

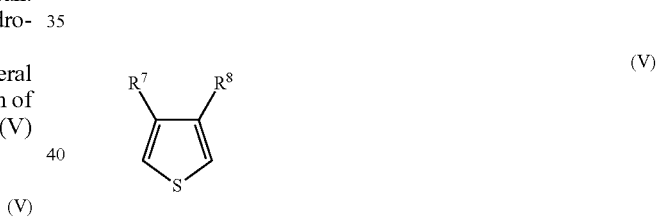

is performed in nonpolar solvents using oxidizing agents selected from the group of the above-described iron(III) salts, in amounts of 0.5-10 mol per mole, preferably of 1-3 mol per mole.

$R^7$ and $R^8$ are each as defined above.

Preferred oxidizing agents are iron(III) salts of aliphatic and aromatic sulphonic acid, more preferably iron(III) p-toluenesulphonate. Particular preference is given to a molar ratio of 1-3 mol of iron(III) p-toluenesulphonate per mole of thiophene. The solvents used may be the water-immiscible solvents listed above.

In the context of the invention, it is also possible to use mixtures of these aforementioned Fe(III) salts of organic acids. The aforementioned Fe(III) salts may optionally be used as catalysts in combination with other oxidizing agents. For the oxidative polymerization of the optionally substituted thiophenes of the formula (V), in theoretical terms, 2.25 equivalents of oxidizing agent are required per mole of thiophene (see, for example, J. Polym. Sc. Part A Polymer Chemistry Vol. 26, p. 1287 (1988)). However, it is also possible to use higher or lower equivalents of oxidizing agent.

The invention still further provides a copolymer which contains at least repeat units of the general formulae (II a) and (III)

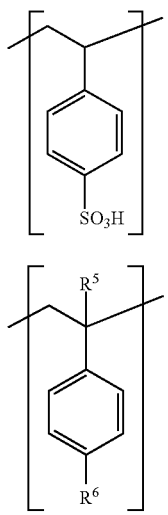

where
R⁵ is H or an optionally substituted $C_1$-$C_{18}$-alkyl radical, preferably H, R⁶ is H or an optionally substituted $C_1$-$C_{30}$-alkyl radical, preferably an optionally substituted $C_1$-$C_{20}$-alkyl radical, more preferably an optionally substituted $C_1$-$C_{12}$-alkyl radical, and the proportion by mass of the repeat unit (II a) is between 2% and 80%, preferably between 2% and 50%, and the proportion by mass of the repeat unit (III) is between 5% and 98%, preferably 50 and 98%.

The definitions of the $C_1$-$C_{18}$-alkyl radical listed here and the $C_1$-$C_{30}$ alkyl radical listed correspond to the abovementioned definitions of these alkyl radicals.

The repeat units of the general formulae (IIa) and (III) may each be the same or different within the copolymer. Preference is given to copolymers with in each case identical repeat units of the general formulae (IIa) and (III).

In the context of the invention, the inventive copolymer has a molecular weight which is between 2 000 to 5 000 000 g/mol, preferably between 10 000 to 1 000 000 g/mol, more preferably between 40 000 g/mol and 600 000 g/mol.

The proportion by mass of the repeat units of the general formula (IIa) and (III) was compared by means of elemental analysis and ¹H NMR. In the elemental analysis, percentages calculated and found are compared. In the ¹H NMR spectrum, characteristic signals for the particular repeat units are considered relative to one another.

The inventive copolymer is soluble or dispersible in a solvent which is water-immiscible. Suitable solvents are the solvents listed above, preferred solvents being aromatic or aliphatic hydrocarbons.

The present invention further provides for the use of the inventive complexes for production of conductive films or coating systems, or as a hole injection layer in organic light-emitting diodes.

The examples which follow serve to illustrate the invention merely by way of example and should not be interpreted as a restriction.

EXAMPLES

Example 1

Synthesis of 4-dodecylacetophenone

Aluminium chloride (227.114 g=1.7 mol) was suspended under argon in methylene chloride (800 ml) and cooled to 0° C. Acetic anhydride (89.872 g=0.88 mol) dissolved in 100 ml of methylene chloride was slowly added dropwise thereto within 30 minutes (min.). The mixture was stirred for about 15 min. and then dodecylbenzene (99.267 g=0.4 mol) dissolved in $CH_2Cl_2$ (at 0° C.) was added dropwise with cooling within 30 min. The reaction was stirred further overnight without cooling. The resulting orange-yellow reaction solution was poured slowly onto 1.5 l of crushed ice and separated from the aqueous phase, which was discarded. The organic phase was extracted by shaking twice each with 500 ml of ~10% hydrochloric acid, saturated sodium carbonate solution and saturated sodium chloride solution. The organic phase was dried over anhydrous magnesium sulphate and the solvent was drawn off on a rotary evaporator. The resulting brown solid was recrystallized from methanol. The crystallization was achieved at 4° C. overnight.

Yield: 106.669 g=0.37 mol=92.4% of theory:

Analyses: 250 MHz, $CDCl_3$; δ=0.90 (dd, 3H, J=5.7, 6.9 Hz), 1.28 (m, 18H), 1.56-1.60 (m, 2H), 2.61 (s, 3H), 2.65 (1, 2H, J=7.3 Hz), 7.27 (d, 2H, J=8.2 Hz), 7.89 (d, 2H, J=8.2 Hz).

Example 2

Synthesis of (p-dodecylphenyl)methylcarbinol

4-Dodecylacetophenone (106.669 g=0.37 mol) was initially charged in methanol (1.1 l) and cooled to 0° C. under argon. To this were added, at intervals of 5 min., a total of 10 portions of $NaBH_4$ (20.39 g=0.54 mol). After the vigorous evolution of gas had abated, the ice bath was removed, and the reaction solution was stirred further at room temperature overnight. The solution was concentrated to dryness, and the white crystalline residue was taken up in 1 l of hexane. The resulting suspension was extracted by shaking twice with 500 ml each time of ~10% hydrochloric acid, which completely dissolved the remaining solid. The organic phase was extracted by shaking twice with 500 ml of saturated sodium chloride solution, dried over magnesium sulphate, filtered off, then concentrated on a rotary evaporator and crystallized at −20° C. The crystals were filtered off and dried.

Yield: 100.032 g=0.35 mol=93.4% of theory.

Analyses: 250 MHz, $CDCl_3$; δ=0.90 (dd, 3H, J=5.4, 6.9 Hz), 1.20-1.35 (m, 18H), 1.51 (d, 3H, J=6.3 Hz), 1.54-1.65 (m, 2H), 1.81 (d, 1H, J=1.9 Hz), 2.60 (1, 2H, J=7.9 Hz), 4.86 (m, 1H), 7.20 (d, 2H, J=7.9 Hz), 731 (d, 2H, J=7.9 Hz).

Example 3

Synthesis of p-dodecylstyrene

A 2 l round-bottom flask which had been provided with a water separator and a reflux condenser was charged initially with 1.2 liters of toluene and then with (p-dodecylphenyl)methylcarbinol (50.082 g=0.173 mol) and p-toluenesulphonic acid monohydrate (0.679 g=3.6 mmol). The mixture was heated to reflux with constant stirring and kept at boiling until no further water separated out. Once the reaction mixture had been cooled to room temperature, the organic phase was extracted by shaking twice with 500 ml each time of water and once with 250 ml of saturated sodium chloride solution. After drying over magnesium sulphate, the solvent was drawn off on a rotary evaporator. A yellow oil was obtained. Subsequently, the two batches were combined. The crude product was purified by column chromatography on 400 g of silica gel 60 with hexane as the eluent, and a fraction size of 100 ml was selected.

$R_f$(carbinol)=0 (hexane)
$R_f$(by-product)=0.70 (hexane)
$R_f$(n-dodecylstyrene)=0.50 (hexane)
Yield: 97.934 g=0.36 mol
Analyses: 250 MHz, $CDCl_3$; δ=0.90 (t, 3H, J=6.6 Hz), 1.20-1.4 (m, 18H), 1.60 (m, 2H), 2.60 (t, 2H, J=7.55 Hz), 5.22 (d, 1H, J=7.85 Hz), 5.73 (d, 1H, J=17.6 Hz), 6.71 (q, 1H), 7.15 (d, 2H, J=8.0 Hz), 135 (d, 2H, J=7.9 Hz)

Example 4

Synthesis of the Silver Salt of p-styrenesulphonic Acid

A 500 ml round-bottom flask was initially charged with 400 ml of water, and 45.046 g of sodium p-styrenesulphonate (45.046 g=0.200 mol) were dissolved therein with stirring at room temperature (RT). To ensure exclusion of light, aluminium foil was wrapped around the flask. The solution was cooled to 0° C. and admixed in portions with 34.225 g of silver nitrate (34.225 g=0.200 mol), which briefly gives rise to a pink precipitate. All subsequent operations were conducted with the best possible exclusion of light. The mixture was stirred at 0° C. for a further 30 min. and the solid was filtered off by means of a D2 glass frit. The resulting filtercake was washed in three portions with 150 ml of ice-water and slurried repeatedly with small amounts of diethyl ether for drying. The cream-coloured solid was taken up in 500 ml of acetonitrile and insolubles were filtered off by means of a D4 glass frit. The solution was concentrated to dryness and the resulting solid was stored overnight in a freezer cabinet.

Yield: 47.890 g=0.165 mol=82.5% of theory.

Example 5

Synthesis of ethyl p-styrenesulphonate

An aluminium foil-wrapped 250 ml round-bottom flask was initially charged with 47.890 g of styrene-4-sulphonic acid silver salt (47.890 g=0.165 mol) in 390 ml of acetonitrile, and admixed with 35.77 g of ethyl bromide (35.77 g=0.33 mol) while stirring with a large stirrer bar. A likewise aluminium foil-wrapped reflux condenser was attached to the flask, which was provided with an argon-filled balloon. The reaction mixture was stirred at 70° C. for 5 hours (h), and, after cooling to room temperature, the silver bromide formed was filtered through a D4 frit and the filtrate was concentrated on a rotary evaporator. The remaining oil was taken up with 400 ml of dichloromethane (DCM) and filtered through a D4 fit with a 5 cm-high silica gel layer. The filter material was extracted repeatedly with 50 ml of DCM each time, and the solvent was drawn off. A yellow, highly viscous oil was obtained.

Yield: 29.457 g=0.139 mol=84.2% of theory.
Analysis (NMR): 250 MHz, $CDCl_3$; δ=1.30 (t, 3H, J=7.3 Hz), 4.12 (q, 2H, J=7.3 Hz), 5.46 (d, 1H, J=11.1 Hz), 5.96 (d, 1H, J=17.7 Hz), 6.77 (dd, 1H, J=11.1, 17.4 Hz), 7.65 (d, 2H, J=8.2 Hz), 7.86 (d, 211, J=8.2 Hz).

Example 6

Synthesis of poly(ethyl p-styrenesulphonate-co-p-dodecylstyrene)

Under an argon atmosphere, a 500 ml flask was initially charged with dichloroethane (250 g) as a solvent. After adding 35.0 g of para-dodecylstyrene (35.0 g=128.45 mmol; preparation described in Example 3) and 7.28 g of ethyl para-styrenesulphonate (7.28 g=34.30 mmol; preparation described in Example 5), the mixture was saturated with argon by means of a gas inlet tube. To this end, argon was passed through the mixture for 15 min. During this time, the mixture was heated to 60° C. The free-radical initiator used was azobisisobutyronitrile (AIBN) which, after saturation with argon, dissolved in a little dichloroethane, was added through a septum. The polymerization solution was purged with argon for a further 5 min. and then polymerized to completion overnight at 60° C. After the slightly viscous polymer solution had been cooled, the polymer was precipitated while stirring in methanol. The polymer obtained after the precipitation was redissolved in tetrahydrofuran (THF) and precipitated again in methanol. The isolated white polymer was dried under high vacuum.

Yield: 18 g=42.6% of theory.
Analysis (GPC): molecular weight (vs. PS in THF): 120 000 g/mol, polydispersity D ($M_w/M_n$): 1.5
Analysis (NMR): 250 MHz, CDCl3; δ=0.88 (3H), 1.20-1.30 (—CH2—, —CH—), 1.40-1.45 (3H, —CH3 ester) 1.45-1.55 (2H), 2.50-2.60 (2H), 4.0-4.1 (2H, —CH2— ester), 6.0-7.0 (4H), 7.3-7.6 (4H, —CH— ester)

NMR spectroscopy analyses can be used to determine the degree of sulphonation; to this end, the peaks at 0.88 ppm ($CH_3$ terminus of the dodecyl group) and 4.0-4.1 ppm ($CH_2$ of the ethyl ester) are considered relative to one another. This gives rise to an integral-corrected ratio of dodecylstyrene to ethyl styrenesulphonate of 1:5.6, this ratio corresponding to a degree of sulphonation of the polymer of 21.09%.

Analysis—Elemental Analysis (EA):

| Element | Value 1 [%] | Value 2 [%] | Ø [%] | m/M [mol] |
|---|---|---|---|---|
| C | 75.67 | 75.32 | 75.50 | 6.29 |
| H | 9.38 | 9.20 | 9.29 | 9.29 |
| S | 2.48 | 2.12 | 2.30 | 0.072 |

This gives rise to a degree of sulphonation of 18.77%. From this follows, for the degree of sulphonation:

| Degree of sulphonation [%] | | |
|---|---|---|
| theoretical | EA | NMR |
| 21.07 | 18.77 | 21.09 |

Example 7 (Inventive)

Synthesis of poly(p-styrenesulphonic acid-co-p-dodecylstyrene)

15.0 g of poly(ethyl p-styrenesulphonate-co-p-dodecylstyrene) (preparation as described in Example 6) was dissolved in 50 ml of dichloroethane and 100 ml of toluene, and heated to 100° C. During the heating, the solution was degassed with argon. 60 g of trimethylsilyl bromide (TMSBr) (60 g=16.33 mmol) were added through a septum over a period of 5 min. The yellow solution was stirred under reflux at 100° C. for 60 h, then concentrated, and the polymer was precipitated in methanol/water. The polymer obtained after the precipitation was subsequently redissolved in tetrahydrofuran (THF) and reprecipitated in methanol. The yellowish polymer isolated was dried under high vacuum.

Yield: 10 g

Analysis (EA):

| Element | Value 1 [%] | Value 2 [%] | Ø [%] | m/M [mol] |
|---------|-------------|-------------|-------|-----------|
| C | 76.38 | 76.72 | 76.55 | 6.38 |
| H | 10.03 | 10.07 | 10.05 | 10.05 |
| S | 2.62 | 2.63 | 2.63 | 0.082 |

This gives rise to a degree of sulphonation of 20.8% (calculated at full hydrolysis)

Analysis (NMR): 250 MHz, $CDCl_3$; δ=0.88 (3H), 1.20-1.40 (—CH2—, —CH—), 1.45-1.55 (2H), 2.50-2.60 (2H), 6.0-7.0 (4H), 7.3-7.6 (—CH— aromatic of the ester)

NMR spectroscopy analyses can be used to determine the degree of hydrolysis of the ester; to this end, the peaks at 0.88 ppm ($CH_3$ terminus of the dodecyl group) and the peak at 4.11 ppm ($CH_2$ of the ethyl ester), which is now barely discernible, are considered relative to one another (1:53.3). This gives rise to a degree of hydrolysis of the ester of approx. 86.7%.

Analysis (GPC):

The sample was dissolved in tetrahydrofuran. The calibration standard used was polystyrene. The detectors used were a UV detector and a refractive index detector (RI).

| Detector | $M_n$ [g/mol] | $M_w$ [g/mol] | D ($M_w/M_n$) |
|----------|---------------|---------------|---------------|
| UV 254 nm | 72000 | 120000 | 1.7 |
| RI | 74000 | 118000 | 1.6 |

Example 8 (Inventive)

Synthesis of a poly(3,4-ethylenedioxythiophene)/poly(p-styrenesulphonic acid-co-p-dodecylstyrene) Complex A 50 ml round-bottom flask was initially charged with 12.5 g of toluene and 1 g of poly(p-styrenesulphonic acid-co-p-dodecylstyrene) from Example 7 and stirred for 10 min. Subsequently, 0.3 g (2.1 mmol) of ethylenedioxythiophene (Clevios M V2, H. C. Starck GmbH) was added. Subsequently, 1.33 g of iron(III) tosylate (2.3 mmol) were added and the mixture was stirred at room temperature for 24 h. Thereafter, the stirrer was switched off, and the resulting dispersion was decanted off after 10 min. After a further 48 h, the mixture was filtered through a filter with a pore size of 0.45 µM.

Analysis: Solids Content

To determine the solids content, 2 g of the sample were dried at 100° C. for 16 h.

The starting weight and the dry content were used to determine a solids content of 8.11%.

Example 9 (Inventive)

Determination of the Specific Resistivity and Use of the Complex in an OLED

The inventive formulation of the poly(3,4-ethylenedioxythiophene)/poly(p-styrenesulphonic acid-co-p-dodecylstyrene) complex from Example 8 was used to construct an organic light-emitting diode (OLED). The procedure in the production of the OLED was as follows:

Preparation of the ITO-Coated Substrate (ITO=Indium Tin Oxide)

ITO-coated glass (Merck Balzers AG, FL, Part. No. 253 674 XO) was cut into 50 mm×50 mm pieces (substrates). The substrates were subsequently cleaned in 3% aqueous Mucasol solution in an ultrasound bath for 15 min. Thereafter, the substrates were rinsed with distilled water and spun dry in a centrifuge. This rinsing and drying operation was repeated 10 times. Immediately prior to the coating, the ITO-coated sides were cleaned in a UV/ozone reactor (PR-100, UVP Inc., Cambridge, GB) for 10 min.

Application of the Hole-Injecting Layer

About 5 ml of the inventive dispersion from Example 8 were filtered (Millipore HV, 0.45 µm), The cleaned ITO-coated substrate was placed onto a spin-coater, and the filtered solution was distributed on the ITO-coated side of the substrate. Subsequently, the supernatant solution was spun off by rotating the plate at 1500 rpm over a period of 30 seconds, Thereafter, the substrate thus coated was dried on a hotplate at 130° C. for 15 min. The layer thickness was 500 nm (Tencor, Alphastep 500).

All further process steps were carried out in pure $N_2$ atmosphere (inert gas glovebox system, M. Braun, Garching), into which the coated substrate was transferred. First, the substrate coated with the dispersion from Example 8 was after-dried on a hotplate at 180° C. for 5 min. The conductivity of the dispersion from Example 8 was determined on separate layers, by applying, through a shadowmask, Ag electrodes of length 2.5 cm at a separation of 0.5 mm (analogously to process step 4). The surface resistivity, determined with an electrometer, was multiplied by the layer thickness, in order to obtain the electrical specific resistivity. The specific resistivity of these layers was approx. 100 000 000 ohm·cm.

Application of the Emitter Layer 5 ml of a 1% by weight xylene solution of a white polymeric emitter were filtered (Millipore HV, 0.45 µm) and distributed on the dried hole-injecting layer. Subsequently, the supernatant solution of the emitter was spun off by rotating the plate at 2500 rpm with the lid closed for 30 seconds. Thereafter, the layer was dried on a hotplate at 180° C. for 10 min. The total layer thickness was 585 nm.

Application of the Metal Cathode

A metal electrode was applied as a cathode to the emitter layer. To this end, the substrate was placed with the emitter layer downward onto a shadowmask which contains holes of diameter 2.5 mm. From two vapour deposition boats at a pressure of p=10-3 Pa, a 5 nm-thick Ba layer and then a 200 nm-thick Ag layer were applied successively by vapour deposition. The vapour deposition rates were 10 Å/s for Ba and 20 Å/s for Ag. The isolated metal electrodes had an area of 4.9 $mm^2$.

Characterization of the OLED

The two electrodes of the organic LED were (contact-) connected to a voltage source via electrical leads. The positive pole was connected to the ITO electrode; the negative pole was connected via a thin flexible Au wire to the metal electrode. The dependence of the OLED current and of the electroluminescence intensity (this is detected with a photodiode (EG&G C30809E)) on the voltage was recorded. Subsequently, the lifetime was determined by flowing a constant current of I=60 μA through the arrangement, and monitoring the voltage and light intensity as a function of time.

Results

The OLED thus produced exhibited the typical diode behaviour of organic light-emitting diodes (cf. FIG. 1). At applied voltage U of 12 volts, the forward current I is 0.57 A/cm² and the luminance L is 9.2 cd/m². The lifetime, defined by the decline in luminescence to half of the starting luminance, is 60 hours at a constant diode current of 60 μA.

The fundamental suitability of anhydrous PEDOT-containing solutions based on the inventive dispersion from Example 8 has thus been demonstrated.

The invention claimed is:

1. A complex comprising an optionally substituted polythiophene and a polyanion, wherein the polyanion comprises a copolymer with repeat units of the formulae (I) and (III), or repeat units of the formulae (II) and (III), or repeat units of the formulae (I), (II) and (III)

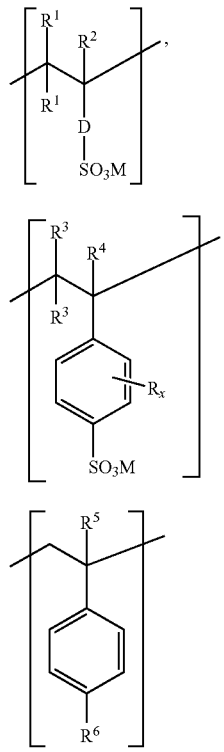

where
R$^1$, R$^2$, R$^3$, R$^4$, R$^5$ are each independently H, an optionally substituted C$_1$-C$_{18}$-alkyl radical, an optionally substituted C$_1$-C$_{18}$-alkoxy radical, an optionally substituted C$_5$-C$_{12}$-cycloalkyl radical, an optionally substituted C$_6$-C$_{14}$-aryl radical, an optionally substituted C$_7$-C$_{18}$-aralkyl radical, an optionally substituted C$_1$-C$_4$-hydroxyalkyl radical or a hydroxyl radical,
R$^6$ is C$_1$-C$_{30}$-alkyl radical,
D is a direct covalent bond or an optionally substituted C$_1$-C$_5$-alkylene radical,
R is a linear or branched, optionally substituted C$_1$-C$_{18}$ alkyl radical, an optionally substituted C$_5$-C$_{12}$-cycloalkyl radical, an optionally substituted C$_6$-C$_{14}$-aryl radical, an optionally substituted C$_7$-C$_{18}$-aralkyl radical, an optionally substituted C$_1$-C$_4$-hydroxyalkyl radical or a hydroxyl radical,
x is an integer from 0 to 4,
M is H or Li$^+$, Na$^+$, K$^+$, Rb$^+$, Cs$^+$, NH$_4^+$, Na$^+$, K$^+$ or another cation,
and the preparation of the repeat units (I) and (II) are between 0 and 50% by mass and the preparation of repeat unit (III) is between 20 and 100% by mass and where the proportion of repeat units (I) and (II) must not both be 0% by mass.

2. The complex according to claim 1, wherein the polyanion is a copolymer with repeat units of the formulae (II) and (III).

3. The complex according to claim 2, wherein the polyanion contains a copolymer with repeat units of the formulae (IIa) and (III)

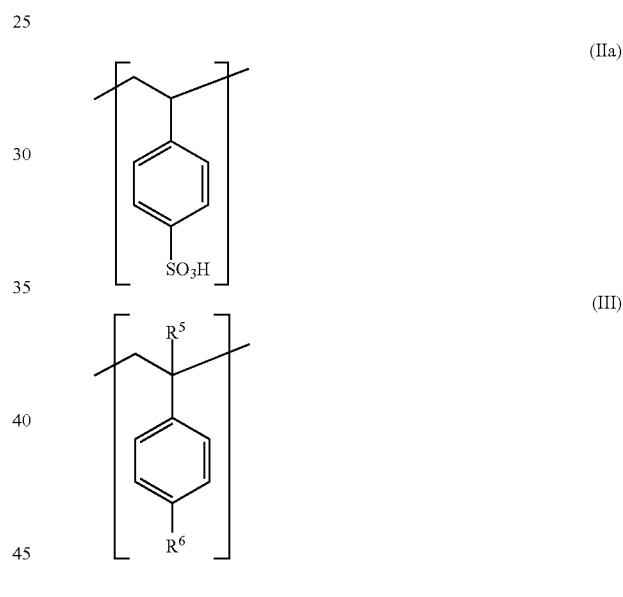

where
R$^5$ is H or an optionally substituted C$_1$-C$_{18}$-alkyl radical and
R$^6$ is C$_1$-C$_{30}$-alkyl radical.

4. The complex according to claim 1, wherein the molecular weight of the polyanion is between 2,000 to 5,000,000 g/mol.

5. The complex according to claim 1, wherein the optionally substituted polythiophene contains repeat units of the general formula (IV)

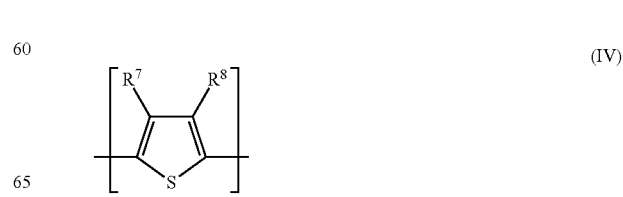

wherein

R$^7$ and R$^8$ are each independently H, an optionally substituted C$_1$-C$_{18}$-alkyl radical or an optionally substituted C$_1$-C$_{18}$-alkoxy radical, or R$^7$ and R$^8$ together are an optionally substituted C$_1$-C$_8$-alkylene radical in which one or more carbon atom(s) may be replaced by one or more identical or different heteroatoms selected from O or S, or an optionally substituted C$_1$-C$_8$-alkylidene radical in which at least one carbon atom may optionally be replaced by a heteroatom selected from O or S.

6. The complex according to claim 5, wherein

R$^7$ and R$^8$ together are an optionally substituted a C$_1$-C$_8$-dioxyalkylene radical, an optionally substituted C$_1$-C$_8$-oxythiaalkylene radical or an optionally substituted C$_1$-C$_8$-dithiaalkylene radical, or an optionally substituted C$_1$-C$_8$-alkylidene radical in which at least one carbon atom may optionally be replaced by a heteroatom selected from O or S.

7. The complex according to claim 1, wherein the optionally substituted polythiophene contains repeat units of the formula (IV-aaa) and/or of the formula (IV-aba)

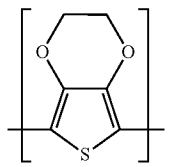

(IV-aaa)

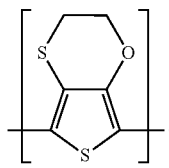

(IV-aba)

8. The complex according to claim 1, wherein the complex is soluble or dispersible in water-immiscible solvents selected from the group consisting of
   a. aromatic or aliphatic hydrocarbons,
   b. aliphatic carboxylic esters,
   c. chlorohydrocarbons, and
   d. aliphatic or araliphatic ethers.

9. A process for producing conductive film or a coating system, or a hole injection layer in organic light-emitting diode which comprises utilizing the complex according to claim 1.

10. A conductive film, a coating system, or a hole injection layer in organic light-emitting diode which comprises the complex according to claim 1.

11. The complex according to claim 1, wherein R$^6$ is C$_1$-C$_{20}$-alkyl radical.

12. The complex according to claim 1, wherein R$^6$ is C$_1$-C$_{12}$-alkyl radical.

13. A copolymer which comprises at least repeat units of the formulae (II a) and (III)

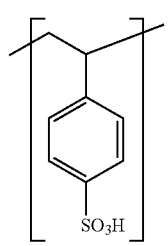

(II a)

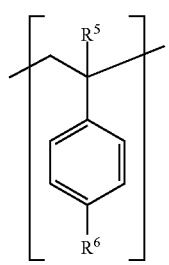

(III)

where

R$^5$ is H or an optionally substituted C$_1$-C$_{18}$-alkyl radical,

R$^6$ is C$_1$-C$_{30}$-alkyl radical, and the proportion by mass of the repeat unit (II a) is between 2% and 80% and the proportion by mass of the repeat unit (III) is between 5% and 98%.

14. The copolymer according to claim 13, wherein R$^6$ is C$_1$-C$_{20}$-alkyl radical.

15. The copolymer according to claim 13, wherein R$^6$ is C$_1$-C$_{12}$-alkyl radical.

16. A process for preparing a complex comprising an optionally substituted polythiophene and a polyanion, wherein the polyanion comprises a copolymer with repeat units of the general formulae (I) and (II), or repeat units of the general formulae (I) and (III), or repeat units of the general formulae (II) and (III), or repeat units of the general formulae (I), (II) and (III)

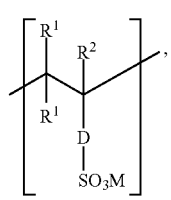

(I)

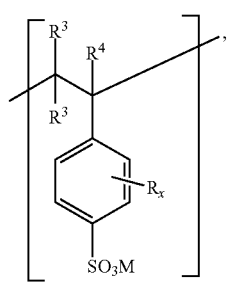

(II)

-continued

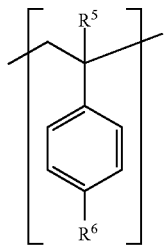

(III)

where
$R^1, R^2, R^3, R^4, R^5$ are each independently H, an optionally substituted $C_1$-$C_{18}$-alkyl radical, an optionally substituted $C_1$-$C_{18}$-alkoxy radical, an optionally substituted $C_5$-$C_{12}$-cycloalkyl radical, an optionally substituted $C_6$-$C_{14}$-aryl radical, an optionally substituted $C_7$-$C_{18}$-aralkyl radical, an optionally substituted $C_1$-$C_4$-hydroxyalkyl radical or a hydroxyl radical, $R^6$ is H or an optionally substituted $C_1$-$C_{30}$-alkyl radical, D is a direct covalent bond or an optionally substituted $C_1$-$C_5$-alkylene radical, R is a linear or branched, optionally substituted $C_1$-$C_{18}$ alkyl radical, an optionally substituted $C_5$-$C_{12}$-cycloalkyl radical, an optionally substituted $C_6$-$C_{14}$-aryl radical, an optionally substituted $C_7$-$C_{18}$-aralkyl radical, an optionally substituted $C_1$-$C_4$-hydroxyalkyl radical or a hydroxyl radical, x is an integer from 0 to 4, M is H or $Li^+$, $Na^+$, $K^+$, $Rb^+$, $Cs^+$, $NH_4^+$, $Na^+$, $K^+$ or another cation, which comprises oxidative polymerizing in the presence of the polyanions, an optionally substituted thiophenes of the formula (V)

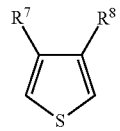

(V)

using oxidizing agents, the thiophene and the oxidizing agent being used in a molar ratio of 0.5-10, in nonpolar solvents, and wherein $R^7$ and $R^8$ are each independently H, an optionally substituted $C_1$-$C_{18}$-alkyl radical or an optionally substituted $C_1$-$C_{18}$-alkoxy radical, or $R^7$ and $R^8$ together are an optionally substituted $C_1$-$C_8$-alkylene radical in which one or more carbon atom(s) may be replaced by one or more identical or different heteroatoms selected from O or S, or an optionally substituted $C_1$-$C_8$-alkylidene radical in which at least one carbon atom may optionally be replaced by a heteroatom selected from O or S.

* * * * *

UNITED STATES PATENT AND TRADEMARK OFFICE
CERTIFICATE OF CORRECTION

PATENT NO.        : 8,721,929 B2                                           Page 1 of 1
APPLICATION NO.   : 12/991050
DATED             : May 13, 2014
INVENTOR(S)       : Loevenich et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 719 days.

Signed and Sealed this
Twenty-ninth Day of September, 2015

Michelle K. Lee
*Director of the United States Patent and Trademark Office*